(12) United States Patent
Cybart et al.

(10) Patent No.: US 10,896,803 B2
(45) Date of Patent: Jan. 19, 2021

(54) ION BEAM MILL ETCH DEPTH MONITORING WITH NANOMETER-SCALE RESOLUTION

(71) Applicant: THE REGENTS OF THE UNIVERSITY OF CALIFORNIA, Oakland, CA (US)

(72) Inventors: Shane A. Cybart, Corona, CA (US); Robert C. Dynes, La Jolla, CA (US)

(73) Assignee: THE REGENTS OF THE UNIVERSITY OF CALIFORNIA, Oakland, CA (US)

(*) Notice: Subject to any disclaimer, the term of this patent is extended or adjusted under 35 U.S.C. 154(b) by 451 days.

(21) Appl. No.: 15/681,210

(22) Filed: Aug. 18, 2017

(65) Prior Publication Data
US 2018/0053626 A1    Feb. 22, 2018

Related U.S. Application Data

(60) Provisional application No. 62/377,504, filed on Aug. 19, 2016.

(51) Int. Cl.
*G01N 17/00* (2006.01)
*H01J 37/30* (2006.01)
(Continued)

(52) U.S. Cl.
CPC ............ *H01J 37/3005* (2013.01); *G01B 7/06* (2013.01); *G01B 7/26* (2013.01); *G01N 27/041* (2013.01);
(Continued)

(58) Field of Classification Search
CPC ......... H01J 37/3005; G01B 7/26; G01B 7/06; H01L 39/249; H01L 39/2496
(Continued)

(56) References Cited

U.S. PATENT DOCUMENTS 3,134,077 A * 5/1964 Hutchins, IV ..... G01R 31/2637
330/2
4,169,009 A    9/1979 Wagner et al.
(Continued)

FOREIGN PATENT DOCUMENTS

JP    4564272 B2    10/2010

OTHER PUBLICATIONS

Ayon, A.A., et al., "Tailoring etch directionality in a deep reactive ion etching tool," J. Vac. Sci. Technol. B, May 2000, 18(3): 1412-1416.
(Continued)

*Primary Examiner* — Farhana A Hoque
*Assistant Examiner* — Courtney G McDonnough
(74) *Attorney, Agent, or Firm* — Eleanor Musick; Musick Davison LLP

(57) ABSTRACT

A method for measuring conductance of a material real-time during etching/milling includes providing a fixture having a socket for receiving the material. The socket is attached to a printed circuit board (PCB) mounted on one side of a plate that has at least one opening for providing ion beam access to the material sample. Conductive probes extend from the other side of the PCB to contact and span a target area of the material. A measurement circuit in electrical communication with the probes measures the voltage produced when a current is applied across the material sample to measure changes in electrical properties of the sample over time.

16 Claims, 8 Drawing Sheets

(51) Int. Cl.
| | |
|---|---|
| *H01J 37/304* | (2006.01) |
| *G01N 27/04* | (2006.01) |
| *G01B 7/06* | (2006.01) |
| *G01B 7/26* | (2006.01) |
| *H01J 37/305* | (2006.01) |
| *H01L 39/24* | (2006.01) |
| *H01L 21/66* | (2006.01) |

(52) U.S. Cl.
CPC ......... *H01J 37/304* (2013.01); *H01J 37/3053* (2013.01); *H01L 22/26* (2013.01); *H01L 39/249* (2013.01); *H01L 39/2496* (2013.01)

(58) Field of Classification Search
USPC ......... 324/754.22, 71.3, 699, 600, 649, 658, 324/663, 686, 691, 693, 694, 696, 713, 324/715, 717, 722, 724, 76.11, 150, 522; 702/1, 57, 64; 257/E21.017–21.02
See application file for complete search history.

(56) References Cited

U.S. PATENT DOCUMENTS

| | | | |
|---|---|---|---|
| 4,309,267 | A | 1/1982 | Boyd et al. |
| 4,532,423 | A * | 7/1985 | Tojo ..................... G01R 31/305 250/310 |
| 5,026,682 | A | 6/1991 | Clark et al. |
| 5,109,164 | A | 4/1992 | Matsui |
| 5,111,491 | A | 5/1992 | Imai et al. |
| 5,229,361 | A | 7/1993 | Shiraishi et al. |
| 5,411,937 | A | 5/1995 | Wendt et al. |
| 5,416,072 | A | 5/1995 | Inada et al. |
| 5,801,393 | A | 9/1998 | Sung et al. |
| 6,924,493 | B1 | 8/2005 | Leung |
| 6,982,240 | B1 | 1/2006 | Clark et al. |
| 9,653,309 | B2 | 5/2017 | Dynes et al. |
| 10,205,081 | B2 | 2/2019 | Cybart et al. |
| 10,224,475 | B2 | 3/2019 | Cybart et al. |
| 2004/0056674 | A1* | 3/2004 | Petersen ............ G01R 1/06733 324/754.11 |
| 2005/0150280 | A1* | 7/2005 | Tang ..................... B82Y 35/00 73/105 |
| 2005/0205872 | A1 | 9/2005 | Hallin et al. |
| 2006/0166506 | A1 | 7/2006 | Okawa et al. |
| 2007/0235322 | A1* | 10/2007 | Wu ........................ B82Y 25/00 204/192.34 |
| 2008/0254627 | A1 | 10/2008 | Wells |
| 2009/0174067 | A1 | 7/2009 | Lin |
| 2009/0273010 | A1 | 11/2009 | Simoen et al. |
| 2010/0230814 | A1 | 9/2010 | Marks et al. |
| 2011/0147609 | A1 | 6/2011 | Shichi et al. |
| 2012/0199737 | A1 | 8/2012 | Maas et al. |
| 2012/0225557 | A1 | 9/2012 | Serry et al. |
| 2015/0309114 | A1* | 10/2015 | Barabi ............... G01R 31/2891 324/750.03 |

OTHER PUBLICATIONS

Bodea et al. "Modification and nano-patterning of high-TC superconducting thin films by masked ion beam radiation," 9th European Conference on Applied Superconductivity (EUCAS 09) IOP Publishing, Journal of Physics: Conference Series 234 (2010).

Cybart, Shane A. et al., Nanometer scale high-aspect-ratio trench etching at controllable angles using ballistic reactive ion etching. J. Vac. Sci. Technol. B 31(1), Jan./Feb. 2013 010604-1-4.

Cybart, Shane A. et al., Very large scale integration of nanopatterned YBa2Cu3O7-δ Josephson Junctions in a Two-Dimensional Array, Nano Letters 2009 vol. 9, No. 10 3581-3585.

PCT/US2013/042766, International Search Report & Written Opinion, dated Sep. 19, 2013, 8 pages.

PCT/US2015/035426, International Search Report and Written Opinion dated Dec. 29, 2015, 9 pages.

Roediger, et al., "Fabrication of arrays of nano-superconducting quantum interference devices using a double-angle processing approach," IEEE Transactions on Applied Superconductivity, vol. 23, No. 3, Part 1, Jun. 2013, Article No. 1100604-1-4.

Takamori, T. et al., Appl. Phys. Lett., vol. 53, year 1988, pp. 2549-2551.

* cited by examiner (i)

(ii)

(iii)

(iv)

ION BEAM MILL ETCH DEPTH MONITORING WITH NANOMETER-SCALE RESOLUTION

RELATED APPLICATIONS

This application claims the benefit of the priority of provisional Application No. 62/377,504, filed Aug. 19, 2016, which is incorporated herein by reference in its entirety.

GOVERNMENT RIGHTS

This invention was made with government support under Contract No. DEAC02 05CH11231 from the Basic Energy Sciences (BES) program of the U.S. Department of Energy (DOE) and Grant No. FA9550-07-1-0493 from the Air Force Office of Scientific Research (AFOSR). The government has certain rights in the invention.

FIELD OF THE INVENTION

The present invention relates to ion etching of nanoscale features and more specifically to a fixture and method for ion etching with real-time feedback to obtain precise control of etch parameters.

BACKGROUND

Broad beam ion sources were originally developed by the United States National Aeronautics and Space Administration (NASA), as well as by other countries, for electric space-propulsion programs in the 1960's. These broad beam ion techniques were adopted in the 1970's for use in industry and research for etching, offering precise control over operating parameters such as ion beam energy, current density. They are indispensable for patterning transition metal oxides. Unfortunately, the procedures for parameter optimization can be tedious and time-consuming. In addition, there is little or no real-time feedback available for monitoring during the actual etching process. To provide one example of existing practices, typical process optimization relies on partially masking a material and performing a single etch followed by profilometry to measure the etched depth to calculate the etch rate. Next, a subsequent etch is performed on another sample and a single variable, e.g., beam energy, is changed to measure the dependence of etch rate on that variable. This sequence is repeated until enough data is obtained to estimate the optimum values. Based on this information, existing techniques determine their endpoints by time using the assumption that etch rates are constant throughout the etch. Once the appropriate parameters are determined, great care must be taken to ensure that no process variables change—otherwise, the etch could deviate significantly from the desired result.

Improved procedures that incorporate precise knowledge about the amount of material that is being removed during etch operations would help eliminate inaccuracies caused by process variable fluctuations such as background pressure, beam voltage, current and neutralization, and would allow adjustments to be made for possible material variations. The present invention is directed to such improvements.

BRIEF SUMMARY

According to embodiments of the invention, a fixture and technique are provided to monitor the conductance of the material while it is being etched to obtain real-time feedback of the etching process, thus enabling the investigation of the material structure at nanoscale and allowing the optimization of all the operating parameters in a single run. For homogeneous materials with uniform conductivity, conductance scales linearly with thickness, making it possible to determine the real-time etch rate for optimization of the ion beam parameters such as pressure, beam voltage, current and neutralization. For materials with a well-known etch rate, the inventive technique can be used to probe changes in conductivity as a function of depth into the material. For multilayer thin films, this method allows etching to be stopped precisely at the transition between two layers by detecting the difference in conductivity.

An assembly and method are provided to allow precise etching of material using broad beam ion sources. The inventive method and fixture enable precision formation of thin films, particularly films where predetermined nanoscale thickness is crucial for the fabrication of high-precision nanoscale devices (e.g., Josephson junctions that enable superconducting electronics).

In an exemplary embodiment, the conductance of the material is measured during the etching process to obtain real-time feedback that allows precise calculation of the amount of material etched and the depth of the etch as well as the thickness of the remaining material. To measure conductance in the hostile environment of a broad beam ion source, the invention comprises a fixture that shields the electrical contacts and wires from those being etched in the beam and masks the electrodes from redeposited material that could short-circuit the measurement. The fixture is built to sustain high temperatures and thermal variations and be chemically compatible with the gases used. The invention enables the fabrication of thin films needed to produce high-quality, high-transition-temperature superconductor (HTS) Josephson junctions using a sub-nanometer focused beam of ions to direct-write insulating barriers into HTS films (see PCT/US2015/035426—International Publication No. WO/2016/003626, "Method for Fabricating Superconducting Devices Using a Focused Ion Beam", which is incorporated herein by reference). Therein, the superconducting film (e.g., transition metal oxide YBCO) has a predetermined film thickness selected so that the energy beam travels through the entire film thickness without substantial lateral straggle.

A method for measuring conductance of a material real-time during etching/milling includes providing a fixture having a socket for receiving the material. The socket is attached to a printed circuit board (PCB) mounted on one side of a plate that has at least one opening for providing ion beam access to the material sample. Conductive probes extend from the other side of the PCB to contact and span a target area of the material. A measurement circuit in electrical communication with the probes measures the voltage produced when a current is applied across the material sample to measure changes in electrical properties of the sample over time.

In one aspect, a fixture for measuring conductance of a material real-time during etching/milling of the material includes: a thermally-conductive base; a socket attached to the base, the socket having at least one recess formed therein for receiving a material sample; a printed circuit board (PCB) having a first side and a second side; a plate attached to the first side of the PCB, the plate having at least one opening therethrough for providing ion beam access to the material sample, the plate configured to be releasably attached to the socket; a plurality of conductive probes extending from the second side of the PCB, the probes configured to contact and span a target area of the material to be etched, and wherein the PCB has circuitry formed thereon in electrical communication with the probes; and a measurement circuit in electrical communication with the probes, wherein a current applied across a first pair of the probes produces a voltage across the material sample to a second pair of the probes to measure changes in electrical properties of the sample over time. In some embodiments, the plurality of conductive probes are spring pins. The measurement circuit may include a lock-in amplifier comprising a sinusoidal current source; a load resistor; first conductors connected to the first pair of probes; second conductors connected to the second pair of probes; and a preamplifier for receiving an input from the second conductors, the preamplifier having a gain; where an output of the preamplifier is input into the lock-in amplifier for data acquisition. The measurement circuit may further include a filter between each of the second pair of probes and the preamplifier.

In another aspect, a method for monitoring changes in conductance of a material with time during etching/milling of the material, includes: retaining the material within the previously-described fixture; and connecting the fixture to a detection device for measuring conductance. The measurement circuit included in the fixture may include: a lock-in amplifier comprising a sinusoidal current source; a load resistor; first conductors connected to the first pair of probes; second conductors connected to the second pair of probes; and a preamplifier for receiving an input from the second conductors, the preamplifier having a gain; where an output of the preamplifier is input into the lock-in amplifier for data acquisition. The plurality of conductive probes may be spring pins. The measurement circuit may further include a filter between each of the second pair of probes and the preamplifier. The thermally-conductive base may be made from copper. The socket may be formed from aluminum.

In still another aspect, a method for monitoring etching of a material real-time during etching/milling includes measuring changes in conductance of the material with time.

In yet another aspect, a method for monitoring etching of a material during etch/milling includes: enclosing a material sample within a fixture so that the material sample is contacted by a four point probe having two current probes electrically connected to a sinusoidal current source and two voltage probes electrically connected to a voltage detection circuit; and measuring changes in conductance of the material sample with time as an etching/milling beam is directed onto the material through at least one opening formed in the fixture. In some embodiments, the four point probes are spring pins. The fixture may include a thermally-conductive base, and further comprising placing the base in contact with a heat exchanging system.

DETAILED DESCRIPTION OF EMBODIMENTS OF THE INVENTION

Figure 1:
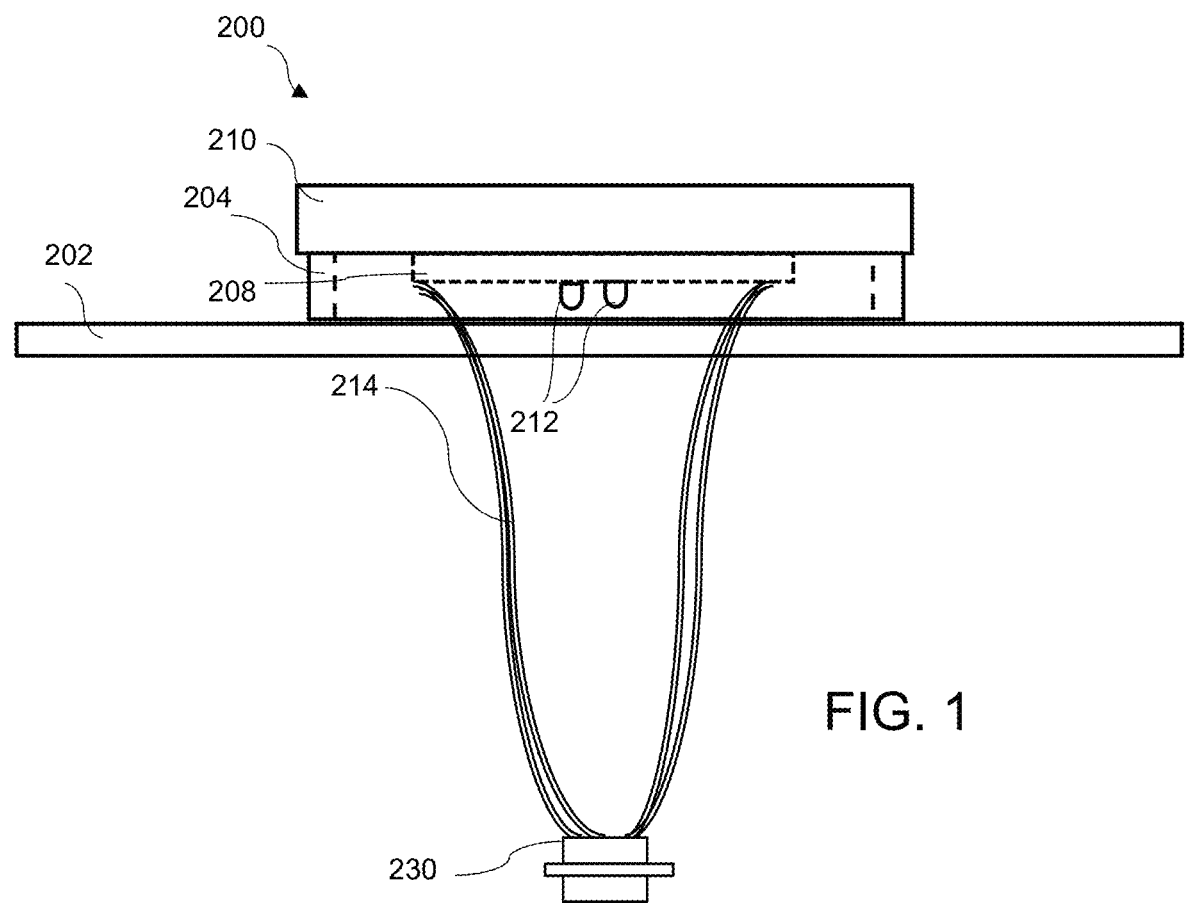
FIG. 1 is a diagrammatic side elevation of a fixture for in situ conductance measurement according to an embodiment of the invention.
Figure 2:
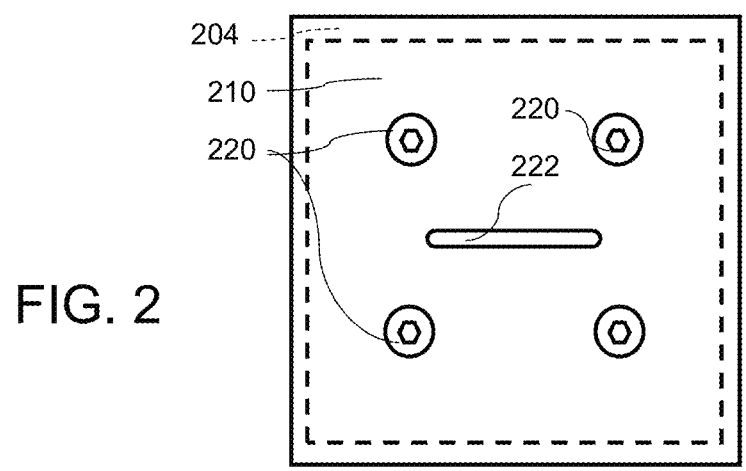
FIG. 2 is a diagrammatic top view of the ceramic plate and socket of the embodiment of FIG. 1.
Figure 3:
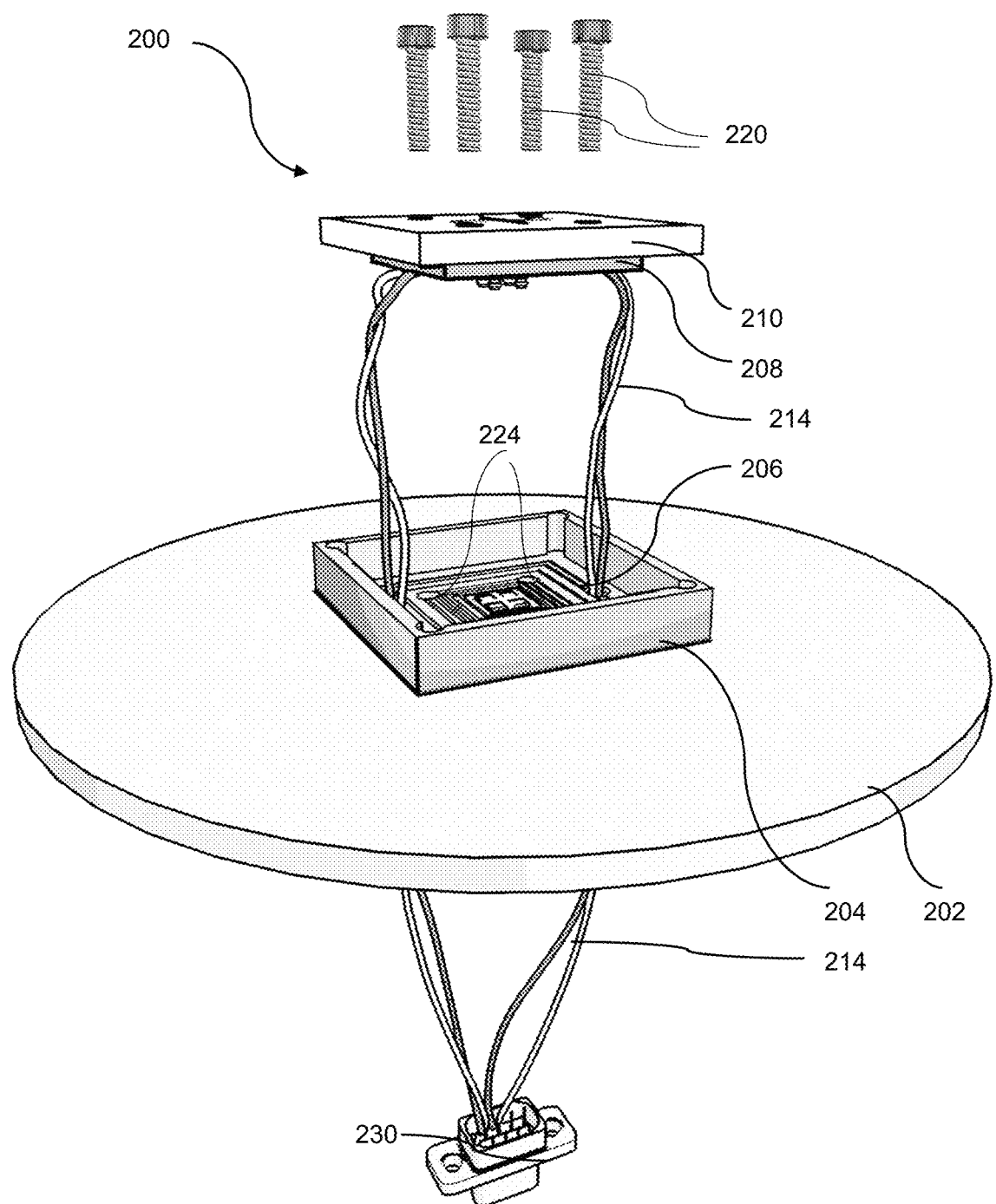
FIG. 3 is a partially exploded perspective view of the fixture according to one embodiment.
Figure 4:
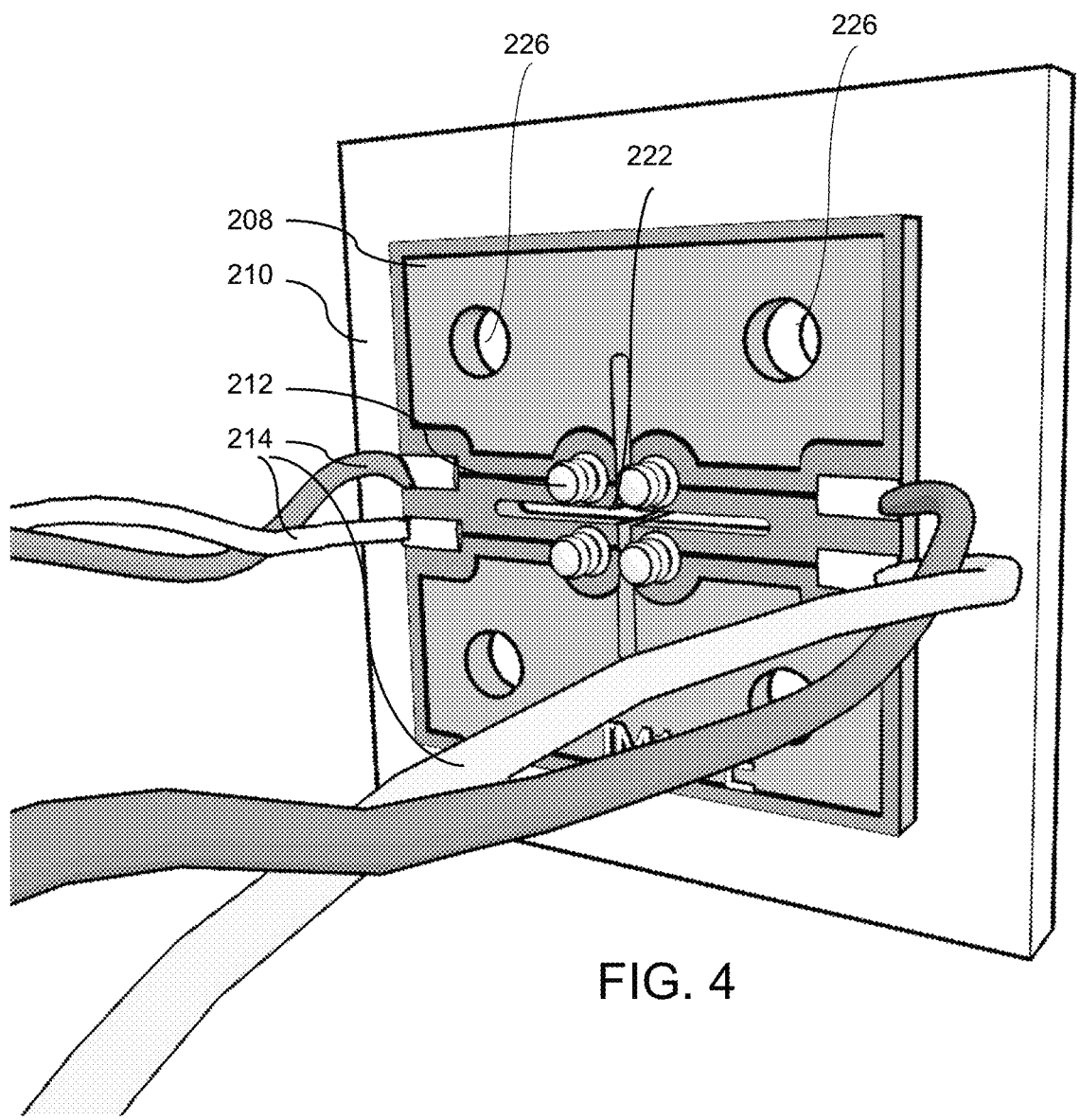
FIG. 4 is a diagrammatic perspective view of the printed circuit board, ceramic plate and connectors of the embodiment of FIG. 1.
Figure 5:
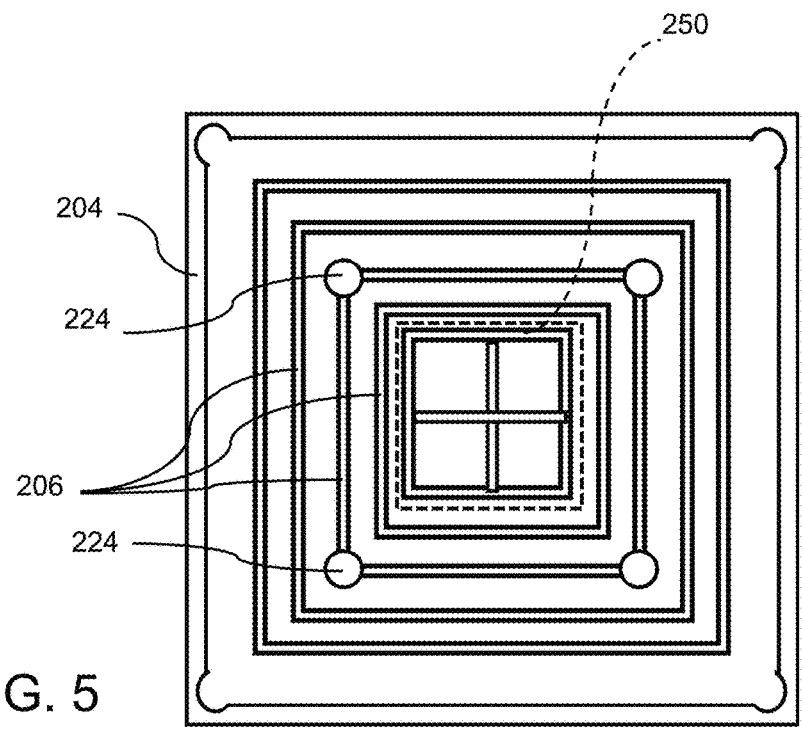
FIG. 5 is a diagrammatic top view of the socket component of the fixture.

An assembly and method are provided for measurement of the conductance of a sample in the hostile environment of a broad beam ion source. The inventive fixture shields the electrical contacts and wires of the assembly from being etched in the beam and masks the electrodes from any re-deposited material that could short-circuit the measurement. The materials used to construct the fixture are selected to tolerate high temperatures and thermal variations, as well as to be chemically compatible with the gases used in the etch process. The examples described herein focus on the milling of oxides and noble metals with inert argon, and therefore are less concerned with potentially adverse chemical reactions that could occur with harsh etch gases. Those of skill in the art will be capable of selecting materials appropriate to withstand the intended etch conditions.

As used herein, "etching/milling" means a process in which ions are accelerated toward a target surface to bombard the material, causing atoms to be removed from the surface. The removal of the atoms may be the result of high energy particle collisions, chemical reactions, or combinations thereof. Throughout this description, the terms "etch" or "etching", "mill" or "milling", and "etching/milling" may be used interchangeably. In each instance, unless otherwise specified, the term refers to the removal of material by directing a beam of ions toward the material surface.

An experimental implementation of the in situ conductance fixture according to an embodiment of the invention for performing real-time conductance measurements in the etch environment is shown diagrammatically in FIGS. 1-5. The test fixture 200 consists of thermally-conductive disk 202, in this case, a 3 mm thick, 100 mm diameter copper disk, with a rectangular (square) socket 204 attached to the upper surface of the disk with a suitable high-temperature adhesive. In the experimental fixture, the socket 204 is aluminum, but other materials may be used as appropriate for the particular etch conditions. One example of an adhesive that may be used is LOCKTITE® 427 adhesive. Multiple square pockets (recesses) 206 are machined into the socket 204 to assist in aligning a sample 250 (shown in FIG. 5 with dashed lines) to the center. All four corners of the sample are masked using a printed circuit board (PCB) 208 and machinable ceramic plate 210. In general, the plate 210 should be made from a material that will be resistant to the harsh conditions within the etch chamber. Therefore, while ceramic is used in the described implementation, it will be readily apparent to those in the art that alternative materials may be selected for use under different etch conditions, e.g., using different ion beam sources.

Surface mounted on the underside of the PCB 208 are four spring-loaded pogo pins 212 that make electrical contact with the masked corners of the test sample. Wires 214 connected to the circuit board 208 pass through one or more openings (not shown) in the copper disk 202 and out the back side of the fixture 200 to connector 230 for data acquisition. Screws 220 or other appropriate fasteners are inserted through openings 226 in ceramic plate 210 and PCB 208 for insertion into corresponding threaded bores 224 formed in socket 204 to releasably attach the ceramic plate 210 to the socket 204. The fixture 200 is then centered above a 3 cm DC Kaufman ion source, and a chilled water heat exchanger is brought into contact with the back side of the copper disk 202 for cooling of the assembly. The ion beam is directed through one or more openings 222 in ceramic plate 210 while conductance is measured across the area being etched. While a single opening 222 is shown in the figures as a slit, other shapes, and multiple openings may be used.

Conductance is determined using a four point probe (defined by pins 212) by passing a sinusoidal current between two corners of the sample and measuring the voltage using a lock-in amplifier on the other two corners. For example, the test signal may be a 100 μA, 13 Hz current.

To evaluate the inventive assembly for real-time etch monitoring, we used a 21 cm gridded ion beam source (Model 21-1500-750 ion beam source, from Ion Tech, Inc. (Fort Collins, Colo.)). As will be apparent to those in the art, other ion beam sources may also be used. The ion source used in testing consists of a discharge chamber and an accelerator system, which includes a screen grid and an accelerator grid in front of the discharge chamber. Instead of using a filament neutralizer, a Plasma Bridge Neutralizer (PBN) was used during testing as an alternative method for neutralizing the ion beam. Other configurations will be readily apparent to those in the art.

Figure 6:
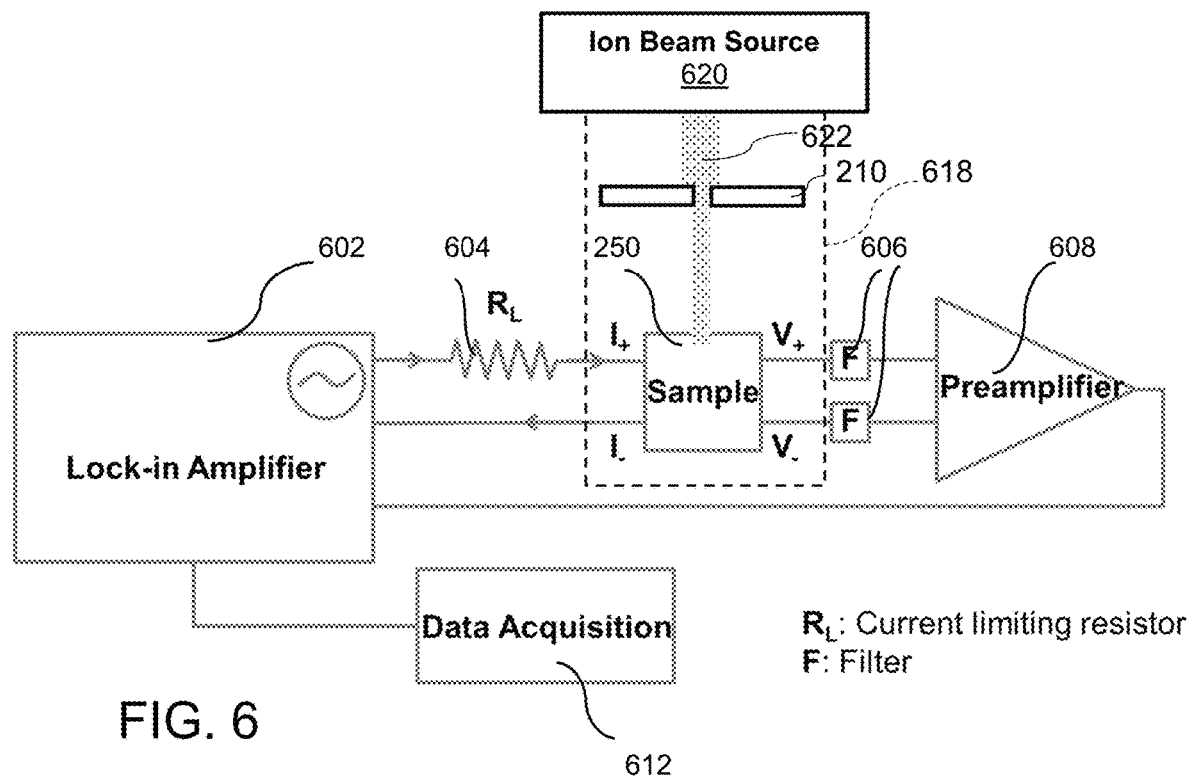
FIG. 6 is a circuit schematic for measuring conductance according to an embodiment of the invention.

Conductance of the material of interest was monitored during etch using a test prototype. Referring to FIG. 6, which illustrates the monitoring set-up, a 1.1 kHz sinusoidal signal is generated by a lock-in amplifier 602. A current source 604 may be used to generate the current for the probes. This current source may be created by using a current limiting resistor $R_L$, as illustrated. The resistor should have a resistance that is much larger than that of the sample, e.g., at least 10× larger than the resistance of the desired film thickness. However, $R_L$ is not necessary if the current is measured directly using a second lock in amplifier. Typical currents are 30 μA. Current is applied to the sample via probes 212 in contact near the corners of sample 250. The figure diagrammatically demonstrates the placement of the sample 250 within the discharge chamber 618 (dashed lines) within which the ion beam source 620 directs an argon (Ar) ion beam 622 through opening 222 to impinge upon the sample. (For simplicity, the socket, PCB and probes are not illustrated in the figure.) The voltage across the sample 610 (collected at probes 212) is filtered by filters 606, then measured by a preamplifier 608 with gain ranging from 10× to 5000×. The amplified signal is then detected by the lock-in amplifier 602 and measured at data acquisition device 612.

Figure 7A:
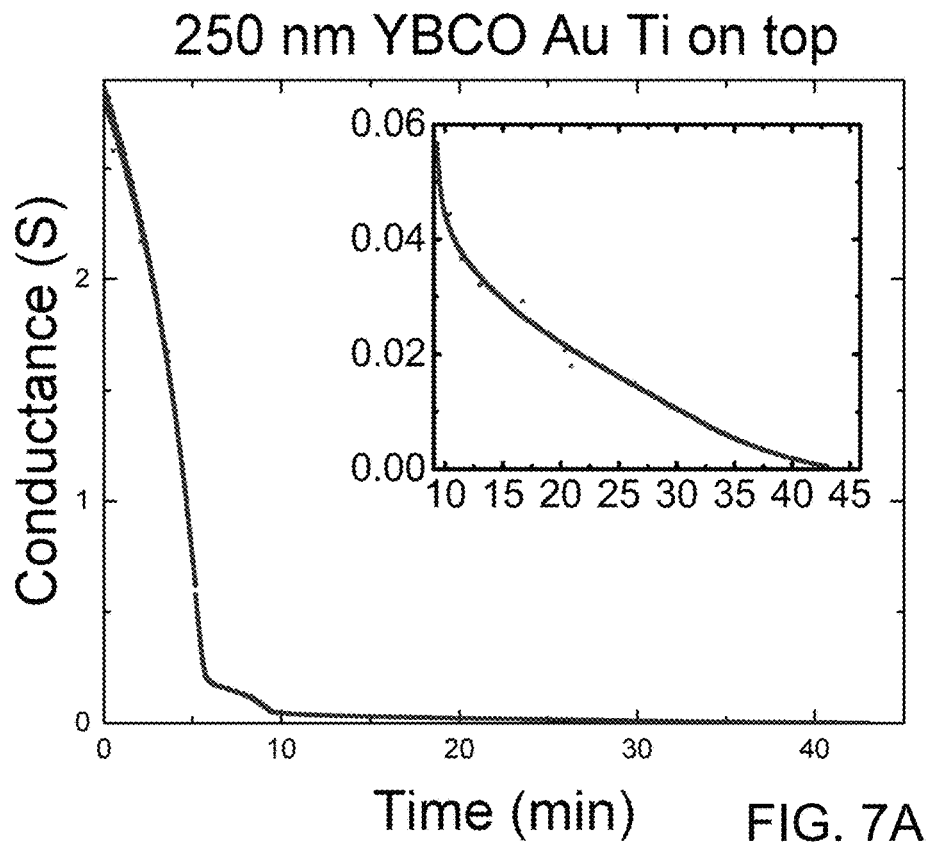
FIG. 7A is a plot of data obtained during an etch of a YBCO film with gold on top with a 5-10 nm titanium sticking layer.
Figure 7B:
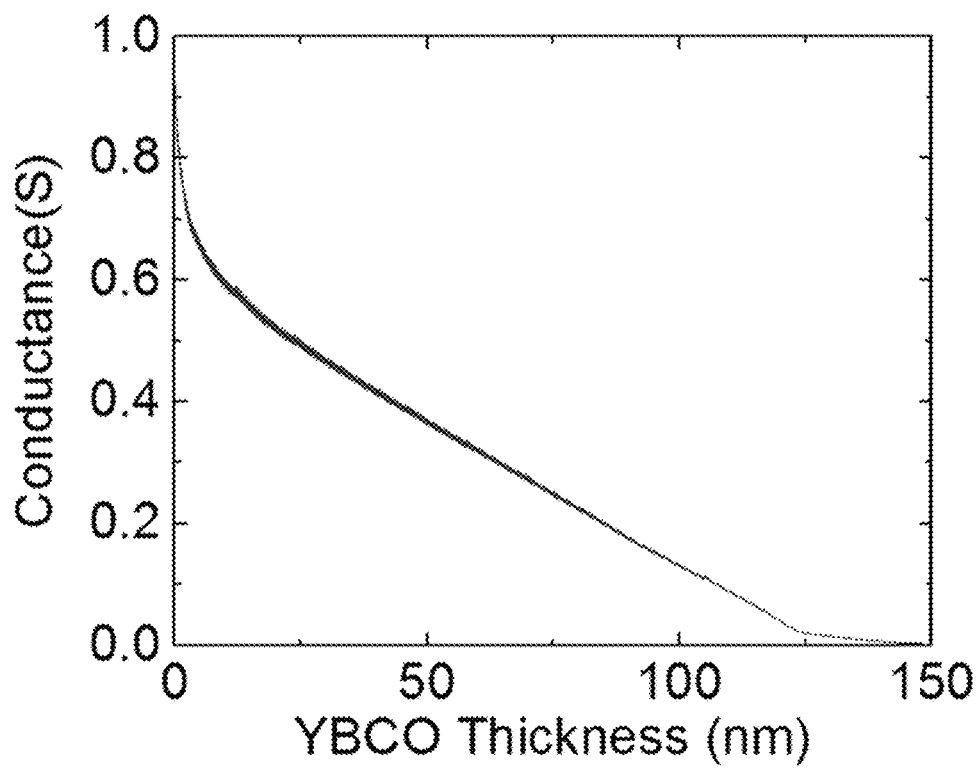
FIG. 7B is a plot showing conductance versus YBCO film thickness.

Initial testing of the fixture was performed on a film having homogenous conductivity. For a uniform film, the conductance is $G=(\sigma w/l)d$, where σ is the conductivity, w is the width, l is the length, and d is the thickness of the film. Because the conductance of the film is proportional to the thickness, it is expected be a linear function of time if the etch rate is constant. The main graph shown in FIG. 7A provides results for a 250 nm YBCO film with Au (gold) [~200 nm] on top with a 5 to 10 nm Ti (titanium) sticking layer confirming expectations. The inset in FIG. 7A provides a more detailed view of conductance with time for the YBCO film. FIG. 7B is a plot showing the generally linear scaling between conductance and thickness for a YBCO film. With this initial confirmation, testing was performed on other films, including multi-layer films.

Figure 8A:
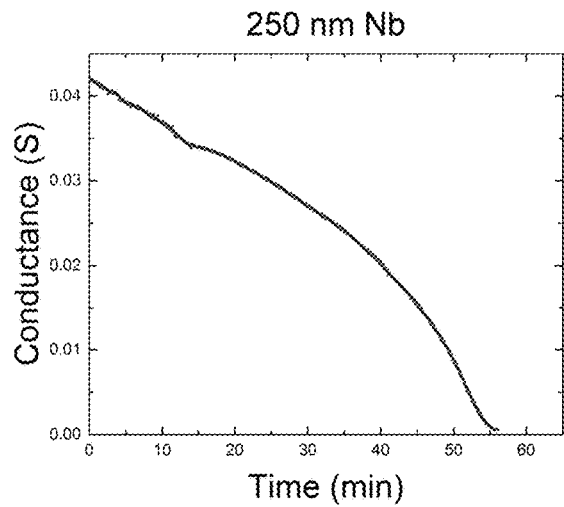
FIGS. 8A-8C are plots of conductance versus time obtained during etching of niobium, silver and Ag—Nb multilayer films, respectively.
Figure 8B:
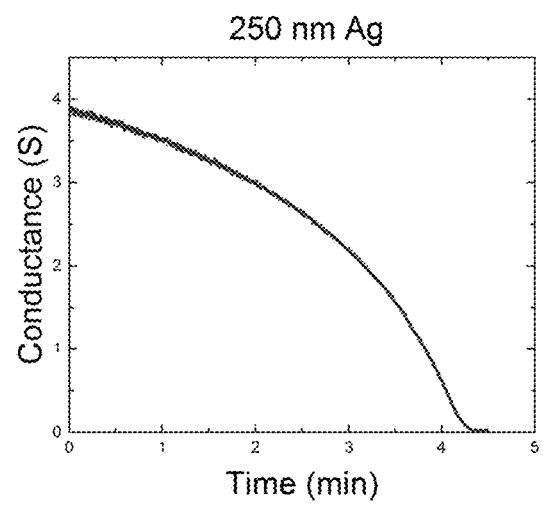
Figure 8C:
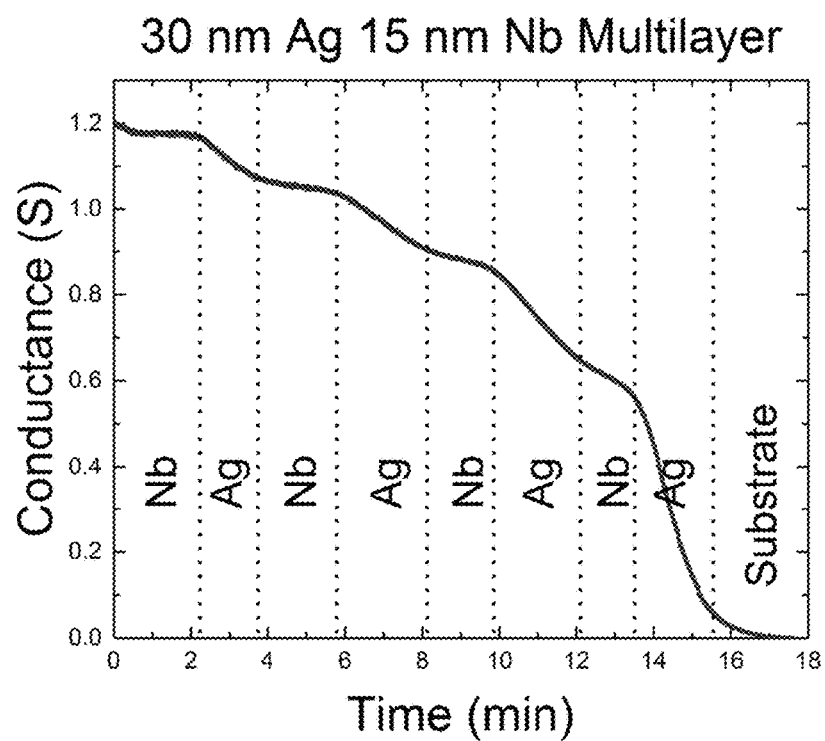
Figure 9A:
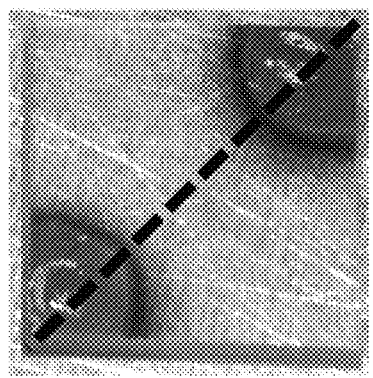
FIG. 9A is a SEM micrograph of a sample after etching.

To examine the resolution of the inventive in-situ monitoring technique, we measured a 250 nm niobium (Nb) film, a 250 nm silver (Ag) film, and an alternating and repeating 30 nm Ag 15 nm-Nb multilayer film, results for which are shown in FIGS. 8A-8C, respectively. Ag and Nb were selected because they have very different conductivities, and they do not form an intermetallic compound. As shown in FIG. 8B, the conductance of the silver film as a function of time is non-linear, which is expected. On the other hand, the slope becomes steeper with increasing etch time. Similar behavior was observed with the niobium film. The same overall trend can be seen during etch of the multilayer film, shown in the conductance vs. time plot in FIG. 8C. This is because the sample is etched down with a slope. From the photomicrograph of the actual sample shown in FIG. 9A, halos are visible at the interface of the sample and the substrate instead of a sharp change.

Figure 9B:
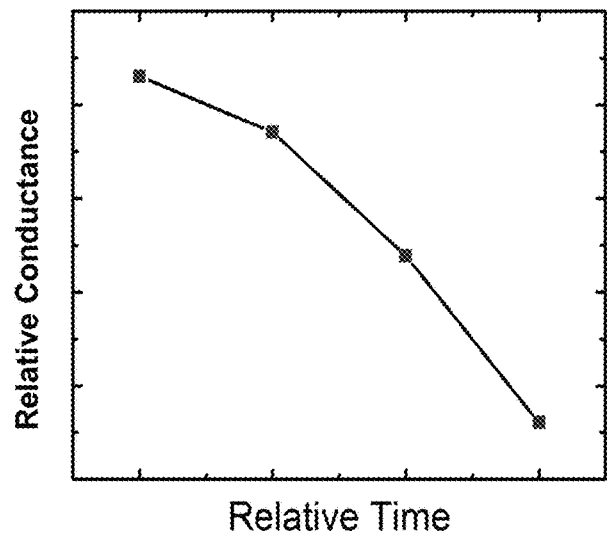
FIG. 9B is a plot of relative conductive versus relative time for the Ag—Nb multilayer film.
Figure 9C:
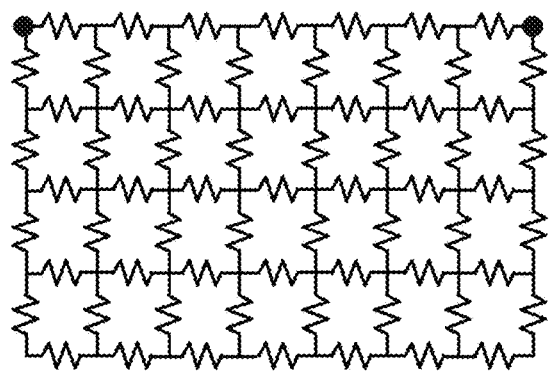
FIG. 9C is a diagrammatic indication of relative resistivity (conductance) at four points in time (i)-(iv) plotted in FIG. 9B.
Figure 9C:
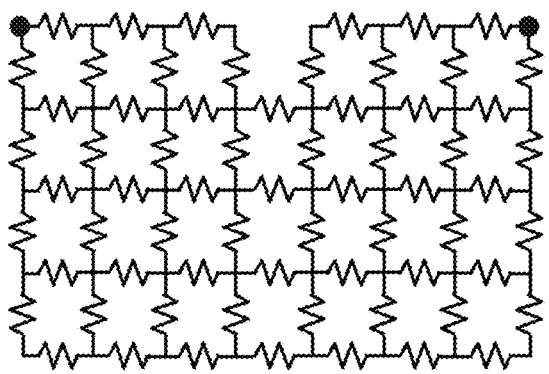
Figure 9C:
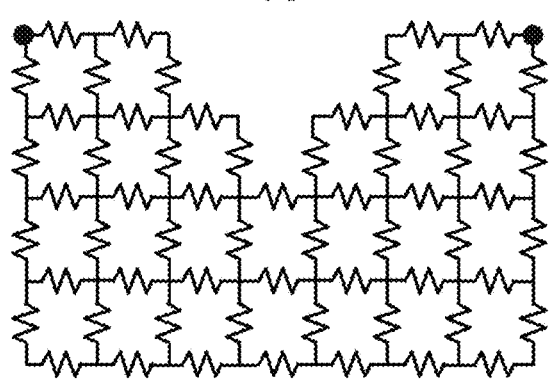
Figure 9C:
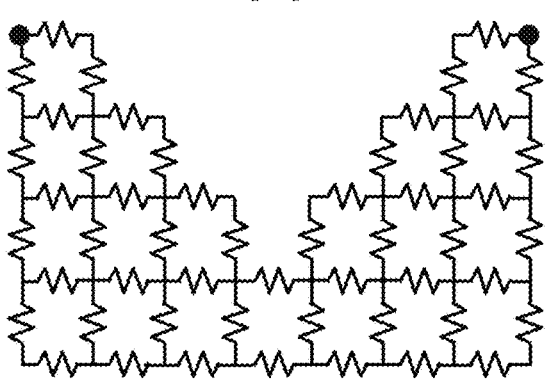
Figure 10:
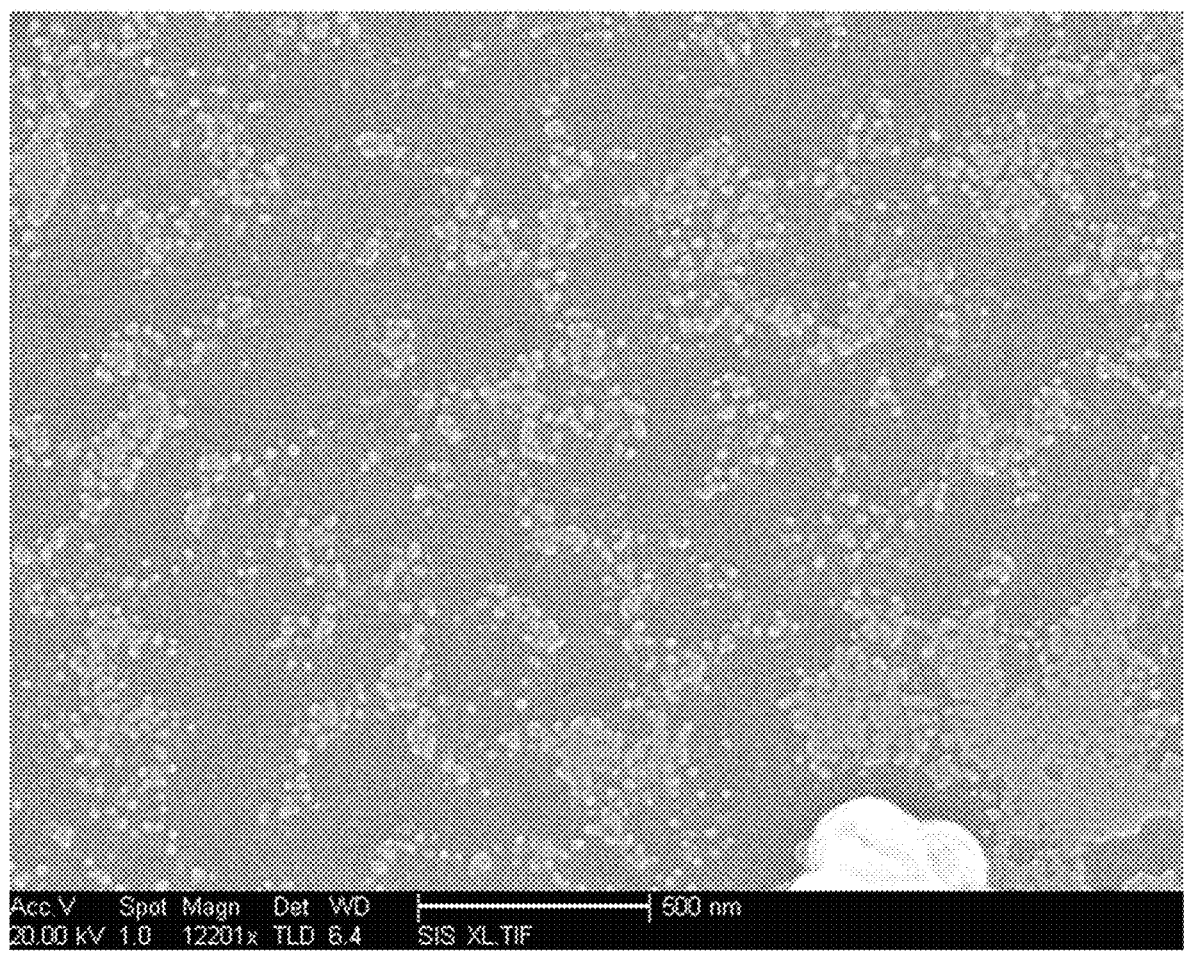
FIG. 10 is a SEM micrograph of a Ag—Nb multilayer film.

Without wishing to be bound by theory, a possible explanation of the increasing slope seen in the plots could be the nature of the etching process itself. Because ion milling is a physical process of ion bombardment, the material is removed randomly rather than continuously. To illustrate, FIG. 10 is an SEM image of the Ag—Nb multilayer film with the transition from one layer to another. Grains of material can be seen as distributed randomly across the sample. Percolation theory suggests a rapid increase of conductivity when grains of materials are grown beyond a certain limit. In the present case, it is the reverse process, where conductivity decreases rapidly when material is removed to a certain limit of discontinuity. This is illustrated diagrammatically in FIG. 9C for four points (i)-(iv) in relative time, which are plotted in FIG. 9B.

The fixture and method of the present invention provide a significant improvement in etch accuracy and control, an essential step toward achieving the necessary precision for repeatable nanometer scale device fabrication. By providing a scheme for generating real-time feedback about the amount of material that is being removed during an etch operation, inaccuracies caused by process variable fluctuations including background pressure, beam voltage, current and neutralization are eliminated. The information also allows for real-time adjustments to be made for possible material variations. The inventive approach also permits observation of transitions between layers in-situ by looking at the change in slope while etching the heterostructure, which enables the etch to be terminated precisely at the transition between different layers of material.

The foregoing description of embodiments of the invention details evaluation of the inventive fixture and method for real-time monitoring during milling of various films using an ion beam. As will be readily apparent to those of skill in the art, the materials described in the examples are not intended to be limiting, but are merely illustrative of the procedures and set-up for real-time monitoring of etching. Similarly, applicability of the inventive approach is not limited to the fabrication of superconducting devices, but rather to any micro- or nanoscale structure, electronic, mechanical, or optical, that may be formed by milling any material, e.g., conductive metals, superconductors, semiconductors, magnetic materials, graphene, doped insulators, and other material, in which the film conductivity or resistivity of the material can be measured via probes contacting the material surface. Further, it will be apparent to those in the art that etching/milling techniques that would benefit from use the inventive fixture for real-time monitoring and improved precision are not limited to ion beam etching. Other processing techniques, including, but not limited to, magnetron sputter etching (MSE), reactive sputter etching (RSE), and reactive ion etching (RIE), could also achieve improved results through real-time monitoring enabled by the fixture. Accordingly, the invention is intended to be limited only by the appended claims.

REFERENCES (INCORPORATED HEREIN BY REFERENCE)

1. H. R. Kaufman, *Rev. Sci. Instrum.* 61 (1990)
2. H. R. Kaufman, *J. Vac. Sci. Technol. B*, 15 (1978)
3. P. D. Reader and H. R. *Kaufman, J. Vac. Sci. Technol. B*, 12 (1975).

The invention claimed is:

1. A fixture for measuring conductance of a material real-time during etching/milling of the material, comprising: a thermally-conductive base; a socket attached to the base, the socket having at least one recess formed therein for receiving a material sample; a printed circuit board (PCB) having a first side, a second side, and at least one PCB opening therethrough; a plate attached to the first side of the PCB, the plate having at least one plate opening therethrough aligned with the at least one PCB opening for providing etch/milling beam access to the material sample, the plate and PCB configured to be releasably attached to the socket; a plurality of conductive probes extending from the second side of the PCB, the probes configured to removably contact and span a target area of the material to be etched, and wherein the PCB has circuitry formed thereon in electrical communication with the probes, and wherein the at least one PCB opening and the at least one plate opening are each configured to expose a target area of the material to the etch/milling beam while masking the probes from the etch/milling beam and from re-deposition of removed material; and a measurement circuit in electrical communication with the probes, wherein a current applied across a first pair of the probes produces a voltage across the material sample to a second pair of the probes to measure changes in electrical properties of the sample over time.

2. The fixture of claim 1, wherein the plurality of conductive probes are spring pins.

3. The fixture of claim 1, wherein the measurement circuit comprises:
a lock-in amplifier comprising a sinusoidal current source;
a load resistor;
first conductors connected to the first pair of probes;
second conductors connected to the second pair of probes; and
a preamplifier for receiving an input from the second conductors, the preamplifier having a gain;
wherein an output of the preamplifier is input into the lock-in amplifier for data acquisition.

4. The fixture of claim 3, wherein the measurement circuit further comprises a filter disposed between each of the second pair of probes and the preamplifier.

5. The fixture of claim 1, wherein the thermally-conductive base comprises copper.

6. The fixture of claim 1, wherein the plate is formed from ceramic.

7. The fixture of claim 1, wherein the socket is formed from aluminum.

8. The method for monitoring changes in conductance of a material with time during etching/milling of the material, comprising:
retaining the material within the fixture of claim 1; and
connecting the fixture to a detection device for measuring conductance.

9. The method of claim 8, wherein the measurement circuit comprises:
a lock-in amplifier comprising a sinusoidal current source;
a load resistor;
first conductors connected to the first pair of probes;
second conductors connected to the second pair of probes; and
a preamplifier for receiving an input from the second conductors, the preamplifier having a gain;
wherein an output of the preamplifier is input into the lock-in amplifier for data acquisition.

10. The method of claim 9, wherein the plurality of conductive probes are spring pins.

11. The method of claim 9, wherein the measurement circuit further comprises a filter disposed between each of the second pair of probes and the preamplifier.

12. The method of claim 8, wherein the thermally-conductive base comprises copper.

13. The method of claim 8, wherein the socket is formed from aluminum.

14. A method for monitoring removal of a material during etch/milling comprising:
enclosing a material sample within a fixture so that the material sample is contacted by a four point probe having two current probes electrically connected to a sinusoidal current source and two voltage probes electrically connected to a voltage detection circuit, the fixture comprising a masking structure having at least one opening formed therein, the at least one opening configured to expose a target area of the material sample to an etch/milling beam while masking the probes from the etch/milling beam and from re-deposition of removed material;
measuring changes in conductance of the material sample with time as the etch/milling beam is directed onto the target area through the at least one opening.

15. The method of claim 14, wherein the four point probes are spring pins.

16. The method of claim 14, wherein the fixture includes a thermally-conductive base, and further comprising placing the base in contact with a heat exchanging system.

* * * * *